United States Patent [19]

Clewer

[11] Patent Number: 5,548,244
[45] Date of Patent: Aug. 20, 1996

[54] METHOD AND APPARATUS FOR ELIMINATING DC OFFSET FOR DIGITAL I/Q DEMODULATORS

[75] Inventor: Richard Clewer, Ijamsville, Md.

[73] Assignee: Hughes Aircraft Company, Los Angeles, Calif.

[21] Appl. No.: 339,136

[22] Filed: Nov. 14, 1994

[51] Int. Cl.$^6$ .............................. H03D 1/00; H03D 3/00; H03D 7/16; H04B 1/26
[52] U.S. Cl. .................. 329/318; 329/323; 329/349; 329/358; 375/317; 455/315
[58] Field of Search .................................. 329/318, 320, 329/323, 341–343, 302, 306, 346, 439, 358; 375/317–319; 455/314–316

[56] References Cited

U.S. PATENT DOCUMENTS

| | | | |
|---|---|---|---|
| 3,860,874 | 1/1975 | Malone et al. | 375/319 X |
| 4,438,524 | 3/1984 | Muilwijk | 329/323 X |
| 4,878,029 | 10/1989 | Saulnier et al. | 329/341 |
| 4,888,557 | 12/1989 | Puckette, IV et al. | 329/341 |
| 5,287,067 | 2/1994 | Denno et al. | 329/341 X |

Primary Examiner—David Mis
Attorney, Agent, or Firm—John T. Whelan; Wanda K. Denson-Low; Gordon R. Lindeen, III

[57] ABSTRACT

A method and apparatus utilizing the techniques of frequency shifting and filtering for converting an input signal having a desired signal at intermediate frequency and an undesired DC offset to a baseband frequency signal in which the undesired DC offset is eliminated. The apparatus includes a first multiplier for multiplying the input signal by a signal having substantially the same intermediate frequency plus an offset frequency ($\Delta f$) to produce a first output signal wherein the desired signal is shifted in frequency to the offset frequency ($\Delta f$) and the undesired DC offset is unaffected. The apparatus also includes a second multiplier coupled to the first multiplier for multiplying the first output signal by a signal having substantially the same offset frequency ($\Delta f$) to produce a second output signal having the desired signal shifted to baseband frequency and the undesired DC offset shifted in frequency to the offset frequency $\Delta f$. In addition, a filter coupled to the second multiplier filters the output signal to remove the undesired DC offset while leaving the desired signal, now located at baseband frequency, intact.

16 Claims, 2 Drawing Sheets

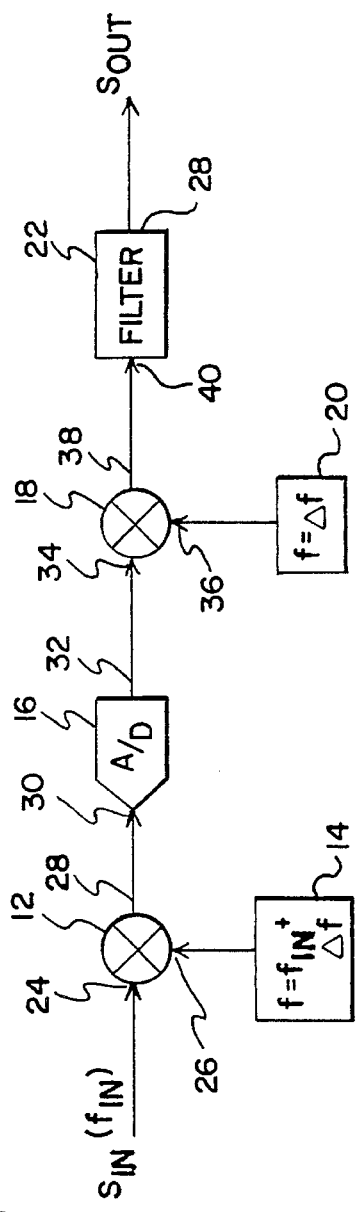
FIG. 1
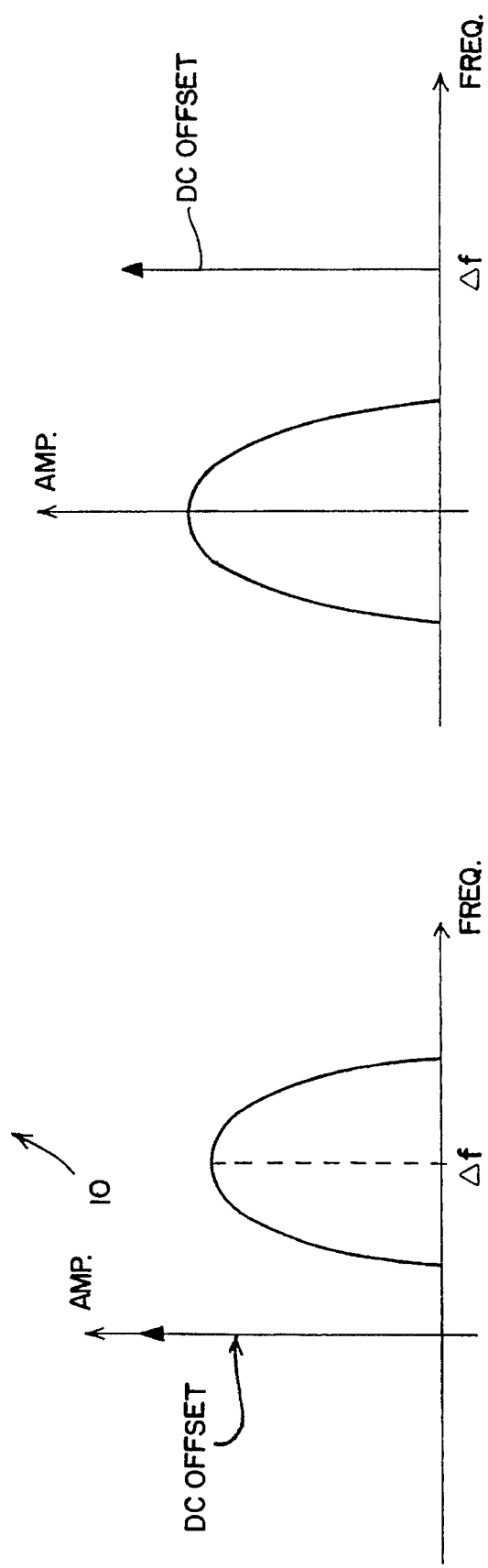
FIG. 1A
FIG. 1B

METHOD AND APPARATUS FOR ELIMINATING DC OFFSET FOR DIGITAL I/Q DEMODULATORS

BACKGROUND OF THE INVENTION

Conventional communications systems include a receiver for receiving and processing transmitted waveforms. The receiver may have a tuner that receives a modulated waveform with a particular frequency bandwidth. The tuner provides analog gain and frequency translation functions necessary for converting the input signal to an intermediate frequency (IF). The IF signal is then shifted down to baseband frequency (i.e., f=0Hz) and separated into its in-phase component (I) and its quadrature-phase component (Q).

DC offsets at baseband signal stages are unavoidable due to the inherent inaccuracies of analog signal processing and analog-to-digital converters. DC offset is a serious problem in digital demodulators, especially those employing high dc-gain elements such as decimators. DC offset also has a detrimental impact on automatic gain control (AGC), carrier recovery and hard and soft decision circuits.

A conventional demodulator circuit receives an input signal at intermediate frequency and converts that signal to a baseband signal. Such a conventional circuit includes a multiplier, a synthesizer, an analog-to-digital converter and a filter. The synthesizer generates a frequency equal to the frequency $f_{IN}$ of the input signal $S_{IN}$. The multiplier multiplies the input signal $S_{IN}$ with the output of the synthesizer to convert the input signal $S_{IN}$ to baseband frequency (i.e., shifted in frequency to 0Hz). The input signal is then digitized by an analog-to-digital converter and filtered through a low pass filter. However, when the baseband signal is filtered through a low pass filter. However, when the base band signal is filtered through a low pass filter, both the base band signal of interest and the undesirable DC offset are output. Thus, the DC offset is present in the output where it will have a detrimental effect on the remainder of the circuitry in which the baseband signal is further processed. Such a result is undesirable.

Conventional DC offset correction involves the measurement of DC offset and subtraction of the measured DC offset from the signal of interest. Such a method is computationally intensive and inaccurate especially in the presence of low frequency baseband signals. In addition, the DC offset measurement is sensitive to DC drift over time and temperature changes especially when the DC offset measurement is performed beforehand when zero signal conditions may exist.

It is thus desirable to eliminate or at least minimize DC offset in a simple and reliable manner. In particular, it is desirable to eliminate the need for a measurement or correction phase which is sensitive to temperature and time drift.

SUMMARY OF THE INVENTION

The present invention relates in general to a method and apparatus for converting an input signal having a desired signal at intermediate frequency and an undesired DC offset to a baseband frequency signal in which the undesired DC offset is eliminated.

According to a first aspect of the present invention, a method for converting an input signal having a desired signal at intermediate frequency and an undesired DC offset to a baseband frequency signal in which the undesired DC offset is eliminated is provided. In particular, the method includes multiplying the input signal by a signal having substantially the same intermediate frequency plus an offset frequency ($\Delta f$) to produce a first output signal wherein the desired signal is shifted in frequency to the offset frequency ($\Delta f$) and the undesired DC offset is unaffected and multiplying the first output signal by a signal having substantially the same offset frequency ($\Delta f$) to produce a second output signal wherein the desired signal is shifted to baseband frequency and the undesired DC offset is shifted to the offset frequency $\Delta f$. And finally filtering the second output signal to remove the undesired DC offset while leaving the desired signal, now located at baseband frequency, intact.

According to another aspect of the present invention, an apparatus is provided for converting an input signal having a desired signal at intermediate frequency and an undesired DC offset into a baseband frequency signal in which the undesired DC offset is eliminated. The apparatus includes a first multiplier for multiplying the input signal by a signal having substantially the same intermediate frequency plus an offset frequency ($\Delta f$) to produce a first output signal wherein the desired signal is shifted in frequency to the offset frequency ($\Delta f$) and the undesired DC offset is unaffected. The apparatus also includes a second multiplier coupled to the first multiplier for multiplying the first output signal by a signal having substantially the same offset frequency ($\Delta f$) to produce a second output signal having the desired signal shifted to baseband frequency and the undesired DC offset shifted in frequency to the offset frequency $\Delta f$ and a filter coupled to the second multiplier for filtering the output signal to remove the undesired DC offset while leaving the desired signal, now located at baseband frequency, intact.

The invention itself, together with further objects and attendant advantages, will best be understood by reference to the following detailed description, taken in conjunction with the accompanying drawings.

BRIEF DESCRIPTION OF THE DRAWINGS

FIG. 1 illustrates a portion of a demodulator according to a preferred embodiment of the present invention.

FIGS. 1A and 1B illustrate waveforms at particular points of the circuit shown in FIG. 1.

DETAILED DESCRIPTION OF THE PRESENTLY PREFERRED EMBODIMENTS

Figure 2:
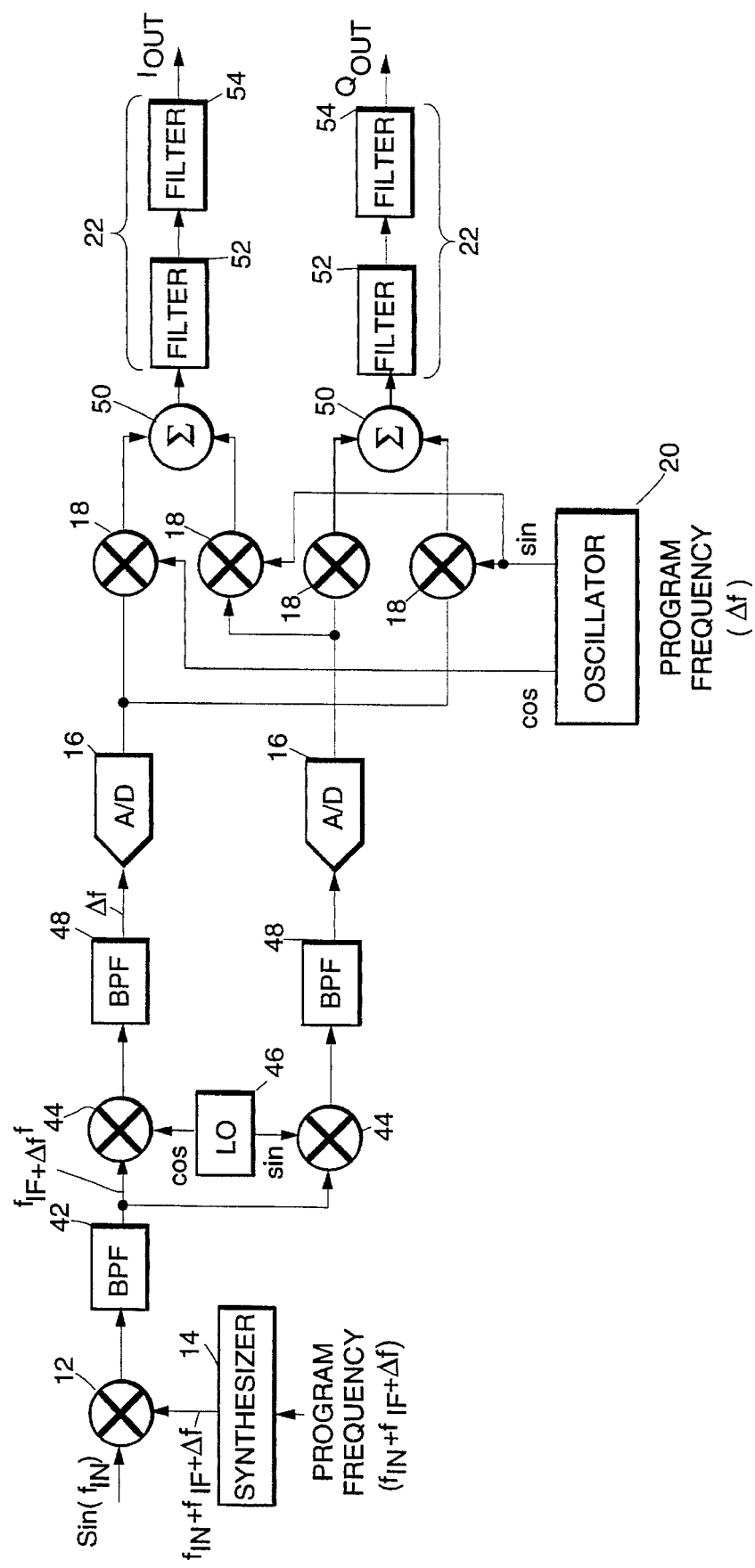
FIG. 2 illustrates the demodulator of the present invention embodied in a modem receiver.

FIG. 1 illustrates a circuit 10 according to the present invention which eliminates the presence of DC offset from a received signal. Circuit 10 includes a first multiplier 12, a synthesizer 14, an analog-to-digital converter 16, a second multiplier 18, an oscillator 20 and a low pass filter 22.

First the physical construction of circuit 10 will be described followed by a description of its operation. The first multiplier 12 has a first input 24, a second input 26 and an output 28. The first input 24 is coupled to receive an input signal $S_{IN}$ having an intermediate frequency $f_{IN}$. The second input 26 is coupled to the output of the synthesizer 14. Synthesizer 14 according to a preferred embodiment of the present invention generates an output signal having a frequency substantially equal to the frequency $f_{IN}$ of the input signal $S_{IN}$ plus an offset frequency $\Delta f$. The analog-to-digital converter 16 has an input 30 coupled to the output 28 of the first multiplier 12 and an output 32. The second multiplier 18 has a first input 34, a second input 36 and an output 38. The first input 34 of the second multiplier 18 is coupled to the output 32 of the analog-to-digital converter 16. The second input 36 of the second multiplier 18 is coupled to an output of the oscillator 20. In a preferred embodiment, oscillator 20 is a numerically controlled oscillator which generates an output signal having a frequency substantially equal to the offset frequency $\Delta f$. The output 38 of the second multiplier 18 is coupled to the input 40 of the filter 22. In a preferred embodiment, filter 22 is a low pass filter preferably having a cutoff frequency less than the offset frequency $\Delta f$. The various components of circuit 10 are standard, off-the-shelf items and thus need not be described in further detail.

The operation of circuit 10 will now be described. Circuit 10 may be used particularly effectively in circuits having demodulators such as receivers. With reference to FIG. 2 which will be described in detail hereinafter, a particular application of circuit 10 in a modem circuit will be described. Unlike the conventional approach of measuring the DC offset and subtracting the measured DC offset from the signal, both of which are sensitive to temperature and time drift as previously described, the circuitry of the present invention does not require any measurement or correction phase. Instead, the techniques of frequency conversion and low pass filtering, which are insensitive to the effects of temperature and time drift, are used and thereby provide a simple and reliable method and apparatus for eliminating DC offset.

More particularly, the operation of circuit 10 shown in FIG. 1 will now be described with the assistance of the waveforms shown in FIGS. 1A and 1B. Because the synthesizer 14 of circuit 10 generates an output signal having a frequency substantially equal to the frequency of the input signal $S_{IN}$ plus an offset frequency $\Delta f$, the input signal $S_{IN}$ is converted to a signal having a frequency $\Delta f$. As illustrated in FIG. 1A, the input signal which would conventionally have been placed at baseband frequency is now shifted to a higher frequency $\Delta f$ so that the undesirable DC offset is now separated from the input signal of interest. The output 32 of the analog-to-digital converter 16 is then multiplied by the output of the oscillator 20. As previously described, oscillator 20 is preferably a numerically controlled oscillator which generates a signal having a frequency substantially equal to $\Delta f$. The result of such a multiplication is that the DC offset is shifted to the higher frequency $\Delta f$ and the signal of interest is returned to baseband frequency as shown in FIG. 1B. Thus when this signal is filtered through filter 22, which is preferably a low pass filter, the DC offset is eliminated and only the signal of interest remains.

FIG. 2 illustrates the present invention incorporated into a specific circuit 100. In particular, the present invention is embodied in the receiver of a modem. The circuit 100 includes many of the same components shown in FIG. 1 and thus the same reference numerals will be used to describe like components. As already described with reference to circuit 10 shown in FIG. 1, circuit 100 includes a first multiplier 12, a synthesizer 14, a couple of analog-to-digital converters 16, a plurality of second multipliers 18, an oscillator 20 and a plurality of filters 22. First the physical construction of circuit 100 will be described followed by a description of its operation.

While FIG. 2 illustrates the present invention embodied in a particular circuit, the present invention, of course as those skilled in the art will appreciate, is not limited to such an application.

The input signal $S_{IN}$ has a frequency equal to $f_{IN}$. The synthesizer 14 generates a program frequency equal to $f_{IN}+f_{IF}+\Delta f$ where $f_{IF}$ is an intermediate frequency. The input signal $S_{IN}$ is multiplied by the output of synthesizer 14 in the first multiplier 12 to shift the input signal to a frequency equal to $f_{IF}+\Delta f$. The signal is then filtered in band pass filter 42 and then separated in two branches to provide the signal's in-phase component (I) and its quadrature-phase component (Q). The separated signals are then sent to second multipliers 44. A local oscillator 46 generates a cosine and sine signal each having a frequency $f_{IF}$ which is also inputted to the second multipliers 44. The result is that the input signal $S_{IN}$ which was located at a frequency equal to $f_{IF}+\Delta f$ is now shifted to a frequency $\Delta f$ with the undesired DC offset unaffected as described with reference to FIG. 1. The outputs of the second multipliers 44 are filtered through band pass filters 48 and then sent to analog-to-digital converters 16 and then applied to a plurality of third multipliers 18 where they are multiplied by the output signals generated by oscillator 20 which is preferably a numerically controlled oscillator. The oscillator 20 generates a cosine and sine signal having a frequency substantially equal to the offset frequency $\Delta f$. The result is that the desired signal which was located at the offset frequency $\Delta f$ is now converted to a base band frequency signal and the DC offset is now shifted to the offset frequency $\Delta f$ as previously explained with reference to the circuitry shown in FIG. 1. The outputs of the third multipliers 18 are sent to a couple of adders and then sent to a group of filters 18 which preferably are low pass filters. In a preferred embodiment, each group of filters 18 include a decimator filter 52 and a matched FIR filter 54.

Of course, it should be understood that a wide range of changes and modifications can be made to the preferred embodiments described above. It is therefore intended that the foregoing detailed description be regarded as illustrative rather than limiting and that it be understood that it is the following claims, including all equivalents, which are intended to define the scope of this invention.

What is claimed is:

1. A method for converting an input signal having a desired signal at intermediate frequency and an undesired DC offset to a baseband frequency signal in which the undesired DC offset is eliminated, comprising the steps of:

multiplying the input signal by a signal having substantially the same intermediate frequency plus an offset frequency ($\Delta f$) to produce a first output signal wherein the desired signal is shifted in frequency to the offset frequency ($\Delta f$) and the undesired DC offset is unaffected;

multiplying the first output signal by a signal having substantially the same offset frequency ($\Delta f$) to produce a second output signal wherein the desired signal is shifted to baseband frequency and the undesired DC offset is shifted to the offset frequency $\Delta f$; and filtering the second output signal to remove the undesired DC offset while leaving the desired signal, now located at baseband frequency, intact.

2. A method according to claim 1 further comprising the step of digitizing the first output.

3. A method according to claim 1 wherein said filtering is performed by a low pass filter.

4. A method for converting an input signal having a desired signal at intermediate frequency and an undesired DC offset to a baseband frequency signal in which the undesired DC offset is eliminated, comprising the steps of:

shifting the undesired DC offset to an offset frequency $\Delta f$ and the desired signal to baseband frequency; and eliminating the undesired DC offset located at the offset frequency Δf.

5. A method according to claim 4 wherein the step of eliminating the DC offset includes filtering the desired signal located at baseband frequency and the undesired DC offset located at frequency Δf through a low pass filter having a cutoff frequency less than the offset frequency Δf.

6. A method according to claim 4 wherein the step of shifting the undesired DC offset to an offset frequency Δf and the desired signal to baseband frequency includes the steps of:

multiplying the input signal by a signal having substantially the same intermediate frequency plus an offset frequency (Δf) to produce a first output signal wherein the desired signal is shifted in frequency to the offset frequency (Δf) and the undesired DC offset is unaffected; and multiplying the first output signal by a signal having substantially the same offset frequency (Δf) to produce a second output signal wherein the desired signal is shifted to baseband frequency and the undesired DC offset is shifted to the offset frequency Δf.

7. An apparatus for converting an input signal having a desired signal at intermediate frequency and an undesired DC offset into a baseband frequency signal in which the undesired DC offset is eliminated, the apparatus comprising:

a first multiplier for multiplying the input signal by a signal having substantially the same intermediate frequency plus an offset frequency (Δf) to produce a first output signal wherein the desired signal is shifted in frequency to the offset frequency (Δf) and the undesired DC offset is unaffected;

a second multiplier coupled to the first multiplier for multiplying the first output signal by a signal having substantially the same offset frequency (Δf) to produce a second output signal having the desired signal shifted to baseband frequency and the undesired DC offset shifted in frequency to the offset frequency Δf; and a filter coupled to the second multiplier for filtering the output signal to remove the undesired DC offset while leaving the decried signal now located at baseband intact.

8. An apparatus according to claim 7 further comprising an analog-to-digital converter coupled between the first and second multipliers for converting the output of the first multiplier to a digital signal.

9. An apparatus for converting an input signal having a desired signal at intermediate frequency and an undesired DC offset into a baseband frequency signal in which the undesired DC offset is eliminated, the apparatus comprising:

means for shifting the undesired DC offset to an offset frequency Δf and the desired signal to baseband frequency; and means for eliminating the undesired DC offset located at the offset frequency Δf.

10. An apparatus according to claim 9 wherein said means for shifting the undesired DC offset to an offset frequency Δf and the desired signal to baseband frequency includes:

a first multiplier for multiplying the input signal by a signal having substantially the same intermediate frequency plus an offset frequency (Δf) to produce a first output signal wherein the desired signal is shifted in frequency to the offset frequency (Δf) and the undesired DC offset is unaffected; and a second multiplier coupled to the first multiplier for multiplying the first output signal by a signal having substantially the same offset frequency (Δf) to produce a second output signal having the desired signal shifted to baseband frequency and the undesired DC offset shifted in frequency to the offset frequency Δf.

11. An apparatus according to claim 9 wherein said means for eliminating the undesired DC offset located at the offset frequency Δf comprises a filter.

12. An apparatus according to claim 11 wherein said filter is a low pass filter having a cutoff frequency.

13. An apparatus according to claim 12 wherein the offset frequency Δf is greater than the cutoff frequency of said low pass filter.

14. An apparatus for converting an input signal having a desired signal at intermediate frequency and an undesired DC offset into a baseband frequency signal in which the undesired DC offset is eliminated, the apparatus comprising:

a synthesizer for generating a signal having a frequency substantially equal to the frequency of the input signal plus an offset frequency Δf;

a first multiplier having a first input coupled to receive the input signal, a second input coupled to the output of the synthesizer and an output, the first multiplier multiplying the input signal by the output of the synthesizer to produce an output signal in which the desired signal is shifted in frequency to the offset frequency Δf and the undesired DC offset is unaffected;

an analog-to-digital converter having an input and an output, the input of the analog-to-digital converter coupled to the output of the first multiplier;

an oscillator for generating a signal having a frequency substantially equal to the offset frequency Δf;

a second multiplier having a first input coupled to the output of the analog-to-digital converter, a second input coupled to the output of the oscillator and an output, the second multiplier multiplying the output, of the analog-to-digital converter by the output of the oscillator to produce an output signal in which the desired signal is shifted in frequency to baseband frequency and the undesired DC offset is shifted in frequency to Δf; and a filter having an input and an output, the input of the filter coupled to the output of the second multiplier, wherein the DC offset located at the offset frequency Δf is filtered leaving only the desired signal at baseband frequency.

15. An apparatus according to claim 14 wherein the filter is a low pass filter.

16. An apparatus according to claim 15 wherein the frequency Δf is outside the bandwidth of the low pass filter.

* * * * *